(12) United States Patent
Royer

(10) Patent No.: US 7,168,623 B1
(45) Date of Patent: Jan. 30, 2007

(54) SELF-ADHESIVE ELECTRONIC CIRCUIT

(75) Inventor: Guillaume Royer, Aix en Provence (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/831,792

(22) PCT Filed: Oct. 21, 1999

(86) PCT No.: PCT/FR99/02564

§ 371 (c)(1),
(2), (4) Date: Oct. 18, 2001

(87) PCT Pub. No.: WO00/25266

PCT Pub. Date: May 4, 2000

(30) Foreign Application Priority Data

Oct. 23, 1998 (FR) .................. 98 13545

(51) Int. Cl.
*G06K 19/06* (2006.01)
(52) U.S. Cl. ............ 235/492; 235/487; 235/488; 235/441
(58) Field of Classification Search ............ 235/492, 235/488, 449, 486, 487, 439, 441, 380
See application file for complete search history.

(56) References Cited

U.S. PATENT DOCUMENTS

| | | | | |
|---|---|---|---|---|
| 4,617,216 A | * | 10/1986 | Haghiri-Tehrani et al. .. | 235/488 |
| 4,701,236 A | * | 10/1987 | Vieilledent .................. | 156/252 |
| 4,727,246 A | * | 2/1988 | Hara et al. .................. | 235/492 |
| 4,797,542 A | * | 1/1989 | Hara .......................... | 235/492 |
| 5,030,309 A | * | 7/1991 | Brignet et al. .............. | 235/487 |
| 5,091,251 A | * | 2/1992 | Sakumoto et al. .......... | 428/352 |
| 5,142,270 A | * | 8/1992 | Appalucci et al. ........ | 340/572.3 |
| 5,299,940 A | * | 4/1994 | Uenaka et al. ............. | 439/76.1 |
| 5,376,588 A | * | 12/1994 | Pendse ........................ | 156/293 |
| 5,500,375 A | * | 3/1996 | Lee-Own et al. ........... | 436/514 |
| 5,514,240 A | * | 5/1996 | Hagiiiri-Teiirani et al. . | 156/252 |
| 5,598,032 A | * | 1/1997 | Fidalgo ....................... | 257/679 |
| 5,612,532 A | * | 3/1997 | Iwasaki ....................... | 235/492 |
| 5,671,525 A | * | 9/1997 | Fidalgo ....................... | 29/600 |
| 5,705,852 A | * | 1/1998 | Orihara et al. .............. | 257/679 |
| 5,708,419 A | * | 1/1998 | Isaacson et al. ......... | 340/572.5 |
| 5,723,907 A | * | 3/1998 | Akram ........................ | 257/723 |
| 5,763,868 A | * | 6/1998 | Kubota et al. .............. | 235/487 |
| 5,859,475 A | * | 1/1999 | Freyman et al. ............ | 257/738 |
| 5,905,429 A | * | 5/1999 | Hornstein et al. ....... | 340/384.6 |
| 5,962,840 A | * | 10/1999 | Haghiri-Tehrani et al. .. | 235/492 |
| 6,031,458 A | * | 2/2000 | Jacobsen et al. ......... | 340/572.5 |

(Continued)

FOREIGN PATENT DOCUMENTS

DE 4232625 A1 * 3/1994

(Continued)

*Primary Examiner*—Uyen-Chau N. Le
(74) *Attorney, Agent, or Firm*—Lisa K. Jorgenson; James H. Morris; Wolf, Greenfield & Sacks, P.C.

(57) ABSTRACT

An electronic circuit including a planar base having first and second base surfaces, an antenna attached on the first surface of the base, and a chip connected to the antenna, characterized in that a double faced adhesive is glued on one of the base surfaces, the double faced adhesive having an opening and the chip being arranged at least partially in the opening.

29 Claims, 6 Drawing Sheets

U.S. PATENT DOCUMENTS

| | | | |
|---|---|---|---|
| 6,049,463 A * | 4/2000 | O'Malley et al. | 361/760 |
| 6,089,461 A * | 7/2000 | Murohara | 235/492 |
| 6,111,303 A * | 8/2000 | Launay | 257/531 |
| 6,163,260 A * | 12/2000 | Conwell et al. | 340/572.8 |
| 6,173,898 B1 * | 1/2001 | Mande | 235/488 |
| 6,191,951 B1 * | 2/2001 | Houdeau et al. | 235/492 |
| 6,435,414 B1 * | 8/2002 | Zafrany et al. | 235/487 |
| 6,665,931 B2 * | 12/2003 | Yamaguchi et al. | 29/850 |
| 6,693,515 B2 * | 2/2004 | Clapper | 340/384.7 |

FOREIGN PATENT DOCUMENTS

| | | | |
|---|---|---|---|
| DE | 44 31 606 A | | 3/1996 |
| EP | 0908843 A1 | * | 4/1999 |
| FR | 2 760 113 A | | 8/1998 |
| JP | 01036496 A | * | 2/1989 |
| JP | 08287208 A | * | 11/1996 |
| JP | 09030169 A | * | 2/1997 |
| JP | 10278458 A | * | 10/1998 |
| JP | 10315668 A | * | 12/1998 |
| JP | 11034563 A | * | 2/1999 |
| JP | 11120313 A | * | 4/1999 |
| JP | 11134458 A | * | 5/1999 |
| JP | 11139054 A | * | 5/1999 |
| JP | 2000251041 A | * | 9/2000 |

* cited by examiner

SELF-ADHESIVE ELECTRONIC CIRCUIT

FIELD OF THE INVENTION

The present invention relates to the attaching of electronic circuits.

DISCUSSION OF RELATED ART

Labels bearing indications readable by a computer peripheral, like a bar code readable by an optical analyzer, have recently appeared. Such a system enables fast identification of a labeled product. For a label to be read, it has to be in front of the analyzer, which implies a handling of the product, the label of which is desired to be read. Finally, the information contained in the bar code cannot be modified.

An electronic label including an antenna connected to a chip enables, by means of an electromagnetic antenna coupled to a computer system, reading and writing information in the chip. It is not necessary to have the electronic label face the antenna for the information exchange to be possible. This type of label has many advantages, since a large amount of immediately rewritable information can be stored therein, without having to handle the object, the label of which is being read. However, conventional electronic devices including a chip generally are too stiff, too thick and too expensive to enable making a robust, inexpensive electronic label of small bulk. Further, attaching the label to the object always is a problem.

SUMMARY OF THE INVENTION

The present invention enables producing in a simple way and with a low cost thin flexible self-adhesive electronic labels which are easy to lay, by machine or by hand.

To achieve this object, the present invention provides an electronic circuit including a planar base, an antenna attached on a first surface of the base, a chip connected to the antenna and a double faced adhesive glued on one of the base surfaces, a slot being made in the double faced adhesive and the chip being arranged at least partially in this slot.

According to an embodiment of the present invention, the chip is glued on the first surface of the base and is connected to the antenna by connection wires, the wires and the chip being covered with a drop of resin.

According to an embodiment of the present invention, the etched surface of the chip faces the first surface of the base, and the chip is connected to the antenna by welding beads.

According to an embodiment of the present invention, the etched surface of the chip faces the back of the first surface of the base, the chip is placed in a slot made through the base, and the chip is connected to the antenna by welding beads, the chip being attached to the base by a drop of resin.

According to an embodiment of the present invention, the etched surface of the chip faces the back of the first surface of the base and the chip is connected to the antenna by welding beads located in connection slots going through the base, the chip being attached to the base by a drop of resin.

According to an embodiment of the present invention, the base is formed of a flexible sheet.

According to an embodiment of the present invention, the surface of the base which does not receive the double-faced adhesive is provided to receive the printing of a pattern, of a text or of a code.

The present invention also provides a method of manufacturing an electronic circuit such as mentioned hereabove, which includes the steps of: forming a rectangle of double faced adhesive including a slot, gluing the adhesive rectangle on a packaging protective film, ungluing the adhesive rectangle from the protective film, and assembling it on the base.

The foregoing objects, features and advantages of the present invention will be discussed in detail in the following non-limiting description of specific embodiments in connection with the accompanying drawings wherein

DETAILED DESCRIPTION

Figure 1:
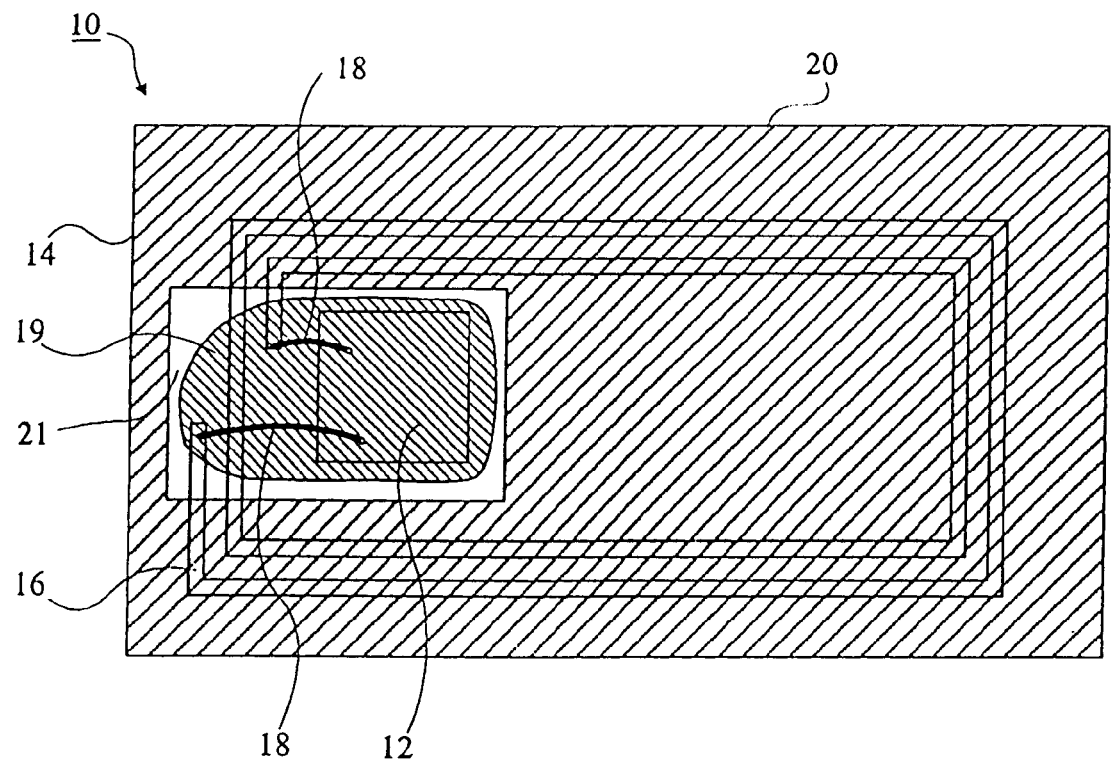
FIG. 1 shows a top view of a label according to a first embodiment of the present invention.
Figure 2:
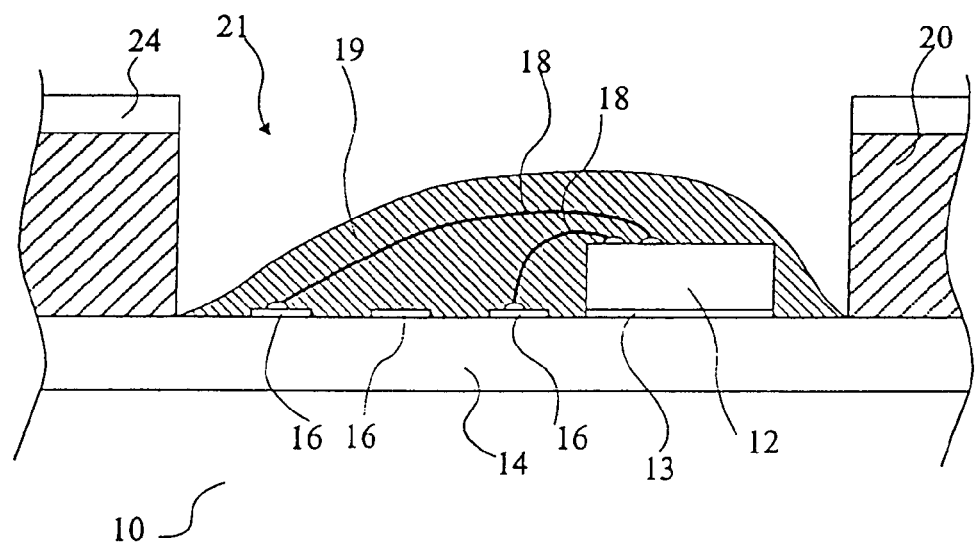
FIG. 2 shows a cross-sectional view of the label of FIG. 1.

The same references designate same elements in the various drawings. FIGS. 1 and 2 show in top view and in cross-section a label 10 according to a first embodiment of the present invention. This label includes a chip 12 attached by a glue layer 13 on a first surface of a base 14. An antenna 16 is also attached to the first surface of base 14. Chip 12 is electronically connected to antenna 16 by connection wires 18. The chip and the wires are caught in a drop of protection resin 19. In the following description, a "double faced adhesive" will designate a segment of a plastic tape conventionally processed to be adhesive on its two surfaces, on a strip of solid glue. A first surface of a double faced adhesive 20 pierced by a slot 21 is glued on the first surface of base 14 to cover the first surface except for the vicinity of resin drop 19, located in slot 21. A strippable sheet 24 covers the second surface of double-faced adhesive 20.

Chip 12 may be glued to the base by means of a glue, epoxy, or other, and connection wires 18 may be attached by a conventional wiring machine. Antenna 16 may be formed on the base in a known manner by metal deposition followed by an etching. The resin drop can be formed by coating, by casting, or by cloisonné. Base 14 is made of a flexible material of low thickness, for example, a piece of a polyester sheet.

The double faced adhesive is thicker than the resin drop and it forms both the adhesive portion of the self-adhesive label and the protective housing of chip 12. The double-faced adhesive is made in a slightly resilient flexible material so that the self-adhesive label is adapted to being glued on a non-planar surface, and is resistant to vibrations and shocks. The glue coating the double-faced adhesive is a joiner's glue enabling a lasting and reliable bond. Double faced adhesives currently available for sale that may be used, for example, are sold by 3M Company under trade name VHB.

As an example, the thickness of base 14 may be 75 μm, the thickness of antenna 16 may be 17 μm, the thickness of glue 13 may be 20 μm, the thickness of chip 12 may be 180 μm, the thickness of drop 19 may be 300 μm, and the thickness of double faced adhesive 20 may be 400 μm. Thus, according to this embodiment, label 10 has a thickness of approximately 500 μm. The thickness of double faced adhesive 20 here is much greater than the height of drop 19 so that a variation of the height of the drop upon its forming may be tolerated.

Figure 3:
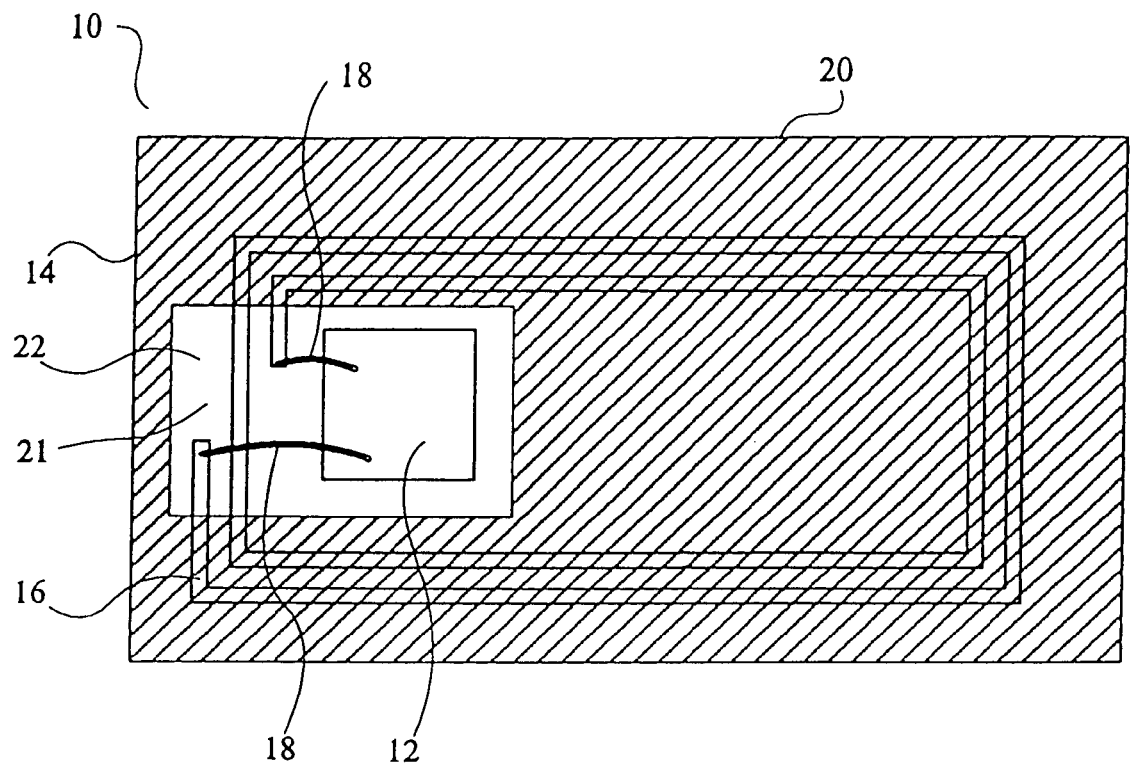
FIG. 3 shows a top view of a label made according to a second embodiment of the present invention.
Figure 4:
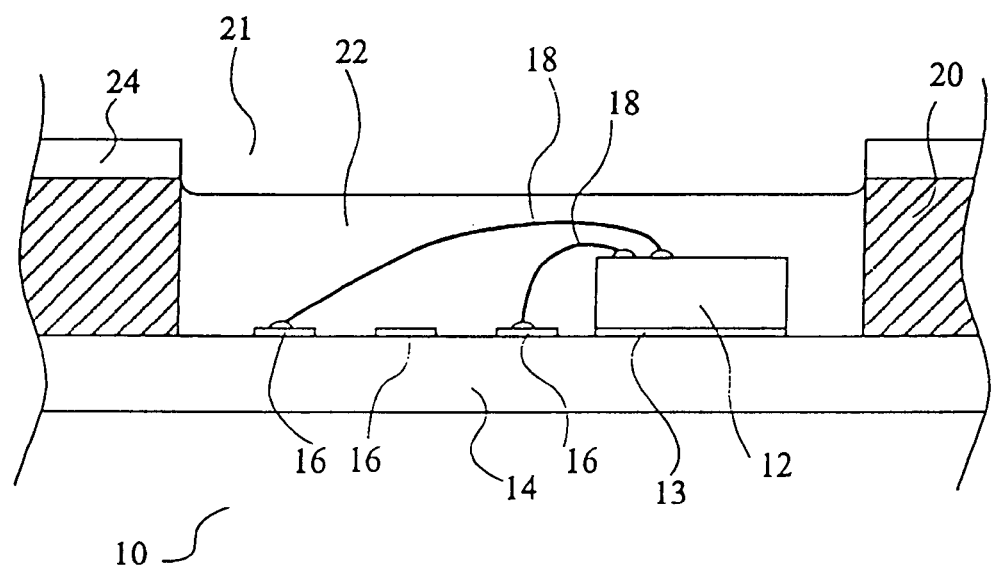
FIG. 4 shows a cross-sectional view of the label of FIG. 3.

FIGS. 3 and 4 show in top view and in cross-section a label 10 according to a second embodiment of the present invention. In this embodiment, connection wires 18 and chip 12 are protected by a resin drop 22 formed by filling slot 21 with resin. The forming of drop 22 here is faster than according to the previous embodiment. Indeed, the methods of forming drop 19 discussed in relation with FIGS. 1 and 2 are slow, whereas it is here sufficient to fill slot 21 with resin. In this embodiment, in addition to the previously mentioned functions, slot 21 through the double-faced adhesive is used to limit the spreading of the resin, which can be chosen to be very fluid.

Figure 5:
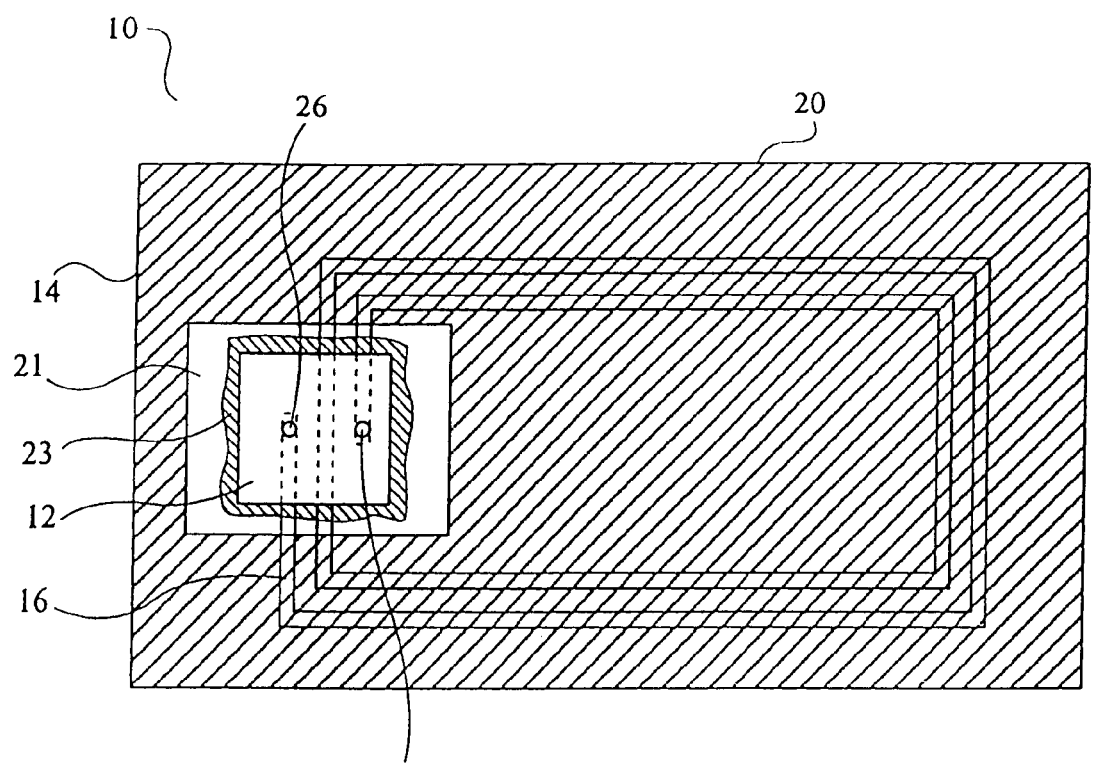
FIG. 5 shows a top view of a label made according to a third embodiment of the present invention.
Figure 6:
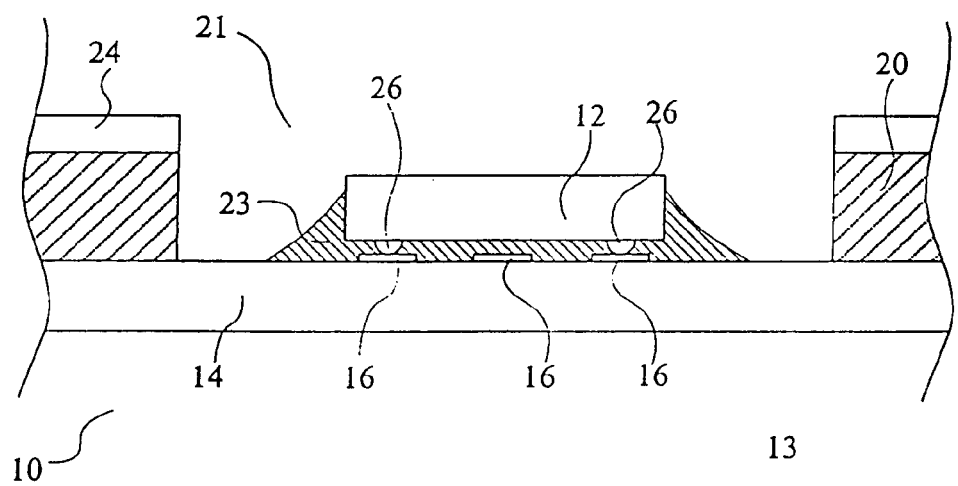
FIG. 6 shows a cross-sectional view of the label of FIG. 5.

FIGS. 5 and 6 show in top view and in cross-section a label 10 according to a third embodiment of the present invention. The front surface or etched surface of chip 12, that is, the surface having received the various processings intended for the forming of an integrated circuit in planar technology, is placed against the first surface of support 14 according to a so-called flip-chip assembly mode, to be electrically connected to antenna 16 via welding beads 26. A resin collar 23 is formed on the circumference of the chip to seal chip 12 on base 14. This embodiment requires an assembly by welding beads, which is delicate to implement, but it enables decreasing the thickness of label 10.

As an example, it is assumed that the welding beads have a substantially constant thickness of 20 μm, and that an allowed variation of 10 μm only can be provided for the depth of slot 21. With a thickness of chip 12 of 180 μm, a double-faced adhesive of a 210-μm thickness can be used. If the total thickness of base 14 and of antenna 16 is close to 95 μm, a label 10 with a thickness close to 300 μm only is obtained.

Figure 7:
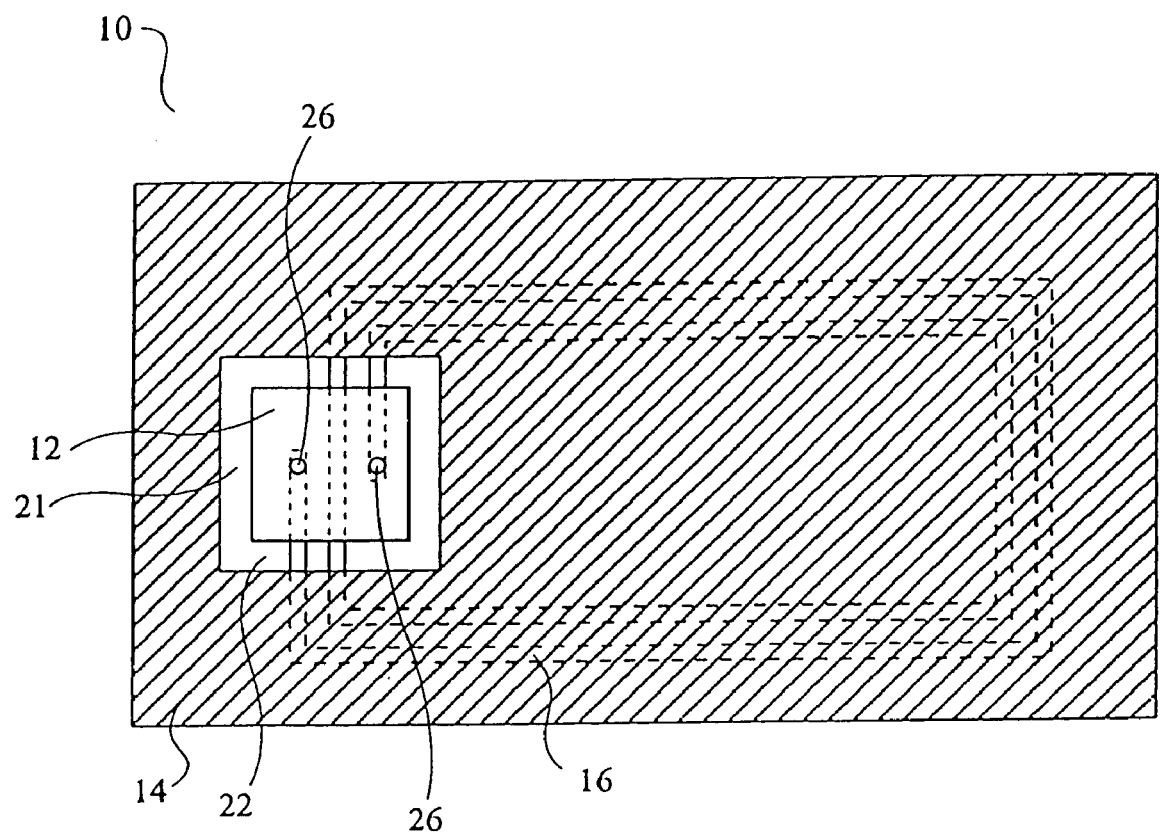
FIG. 7 shows a top view of a label made according to a fourth embodiment of the present invention.
Figure 8:
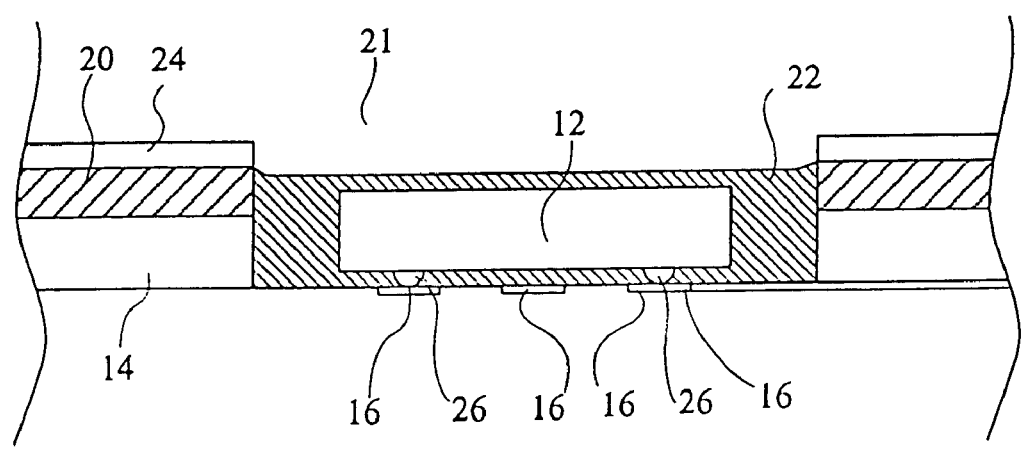
FIG. 8 shows a cross-sectional view of the label of FIG. 7.

FIGS. 7 and 8 show in top view and in cross-section a label 10 according to a fourth embodiment of the present invention. Antenna 16 here is located on the surface of base 14 which is not covered by double faced adhesive 20. Further, base 14 is crossed by a slot 21 which substantially prolongs slot 21 of double-faced adhesive 20. Chip 12 is located in slot 21, with its etched surface facing the back of antenna 16 and being connected to the back of the antenna by welding beads 26. Slot 21, in base 14 and double faced adhesive 20, is filled with a drop of resin 22. This embodiment requires a slot 21 of the base and a connection by welding beads, but it enables decreasing the thickness of label 10.

As an example, if the thickness of the base is 75 μm, the thickness of the antenna is close to 20 μm, the thickness of chip 12 is 180 μm and the thickness of welding beads 26 is approximately 20 μm, then an adhesive of approximately 135 μm can be used, to obtain a label 10 of a thickness close to 230 μm. This thickness is substantially that of a conventional non-electronic self-adhesive label.

Figure 9:
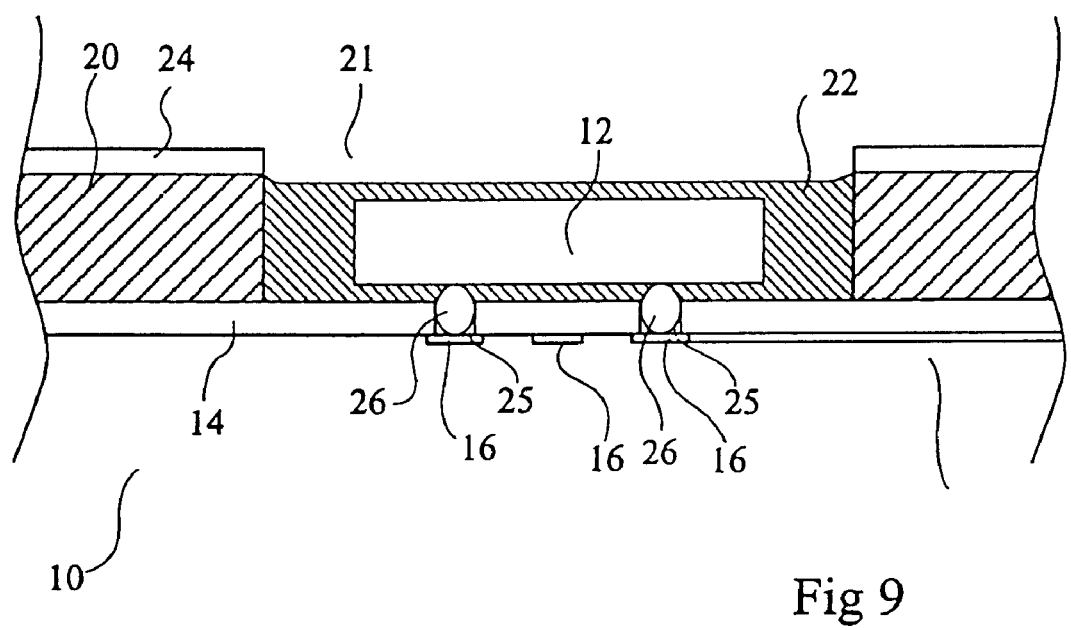
FIG. 9 shows a cross-sectional view of a label made according to a fifth embodiment of the present invention.

FIG. 9 shows in cross-section a label 10 according to a fifth embodiment of the present invention. Antenna 16 is located on the same surface of base 14 as in FIGS. 7 and 8. Chip 12 is located in slot 21 of double faced adhesive 20, its etched surface facing the back of antenna 16, and being connected to the back of the antenna by welding beads 26 through connection slots 25 made in base 14.

Figure 10:
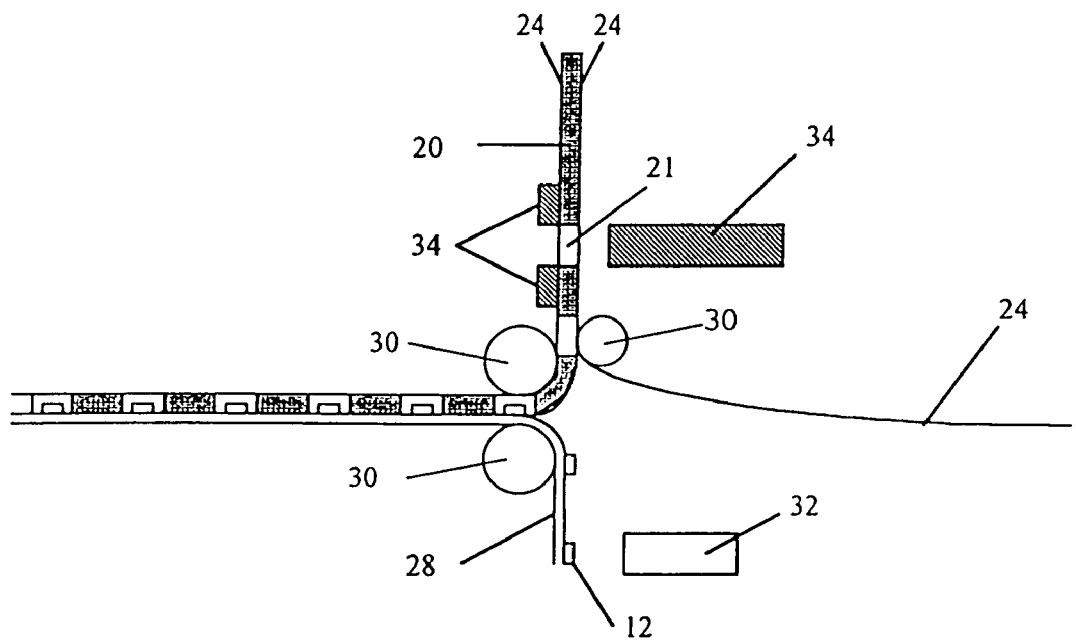
FIG. 10 shows a method of manufacturing self-adhesive electronic labels according to an embodiment of the present invention.

FIG. 10 illustrates a method of manufacturing self-adhesive labels according to the embodiment described in relation with FIGS. 3 and 4. A series of antennas (not shown) has been formed on a mechanically indexed strip 28 intended for being cut into a series of bases. A chip 12 has been glued at the level of each antenna on the indexed strip, which is provided to a laminating machine 30. The machine also receives a double faced adhesive 20 covered with a protective film 24 on both its surfaces. A sensor 32 spots the position of each chip 12 and controls a punch 34 to form, in the double faced adhesive, a slot 21 corresponding to this position. Protective film 24 is removed from a first surface of cut-up double-faced adhesive 20, which is laminated and glued on the indexed strip. Each chip 12 is then connected to the corresponding antenna by connection wires (not shown), after which slot 21 is filled with drops of resin (not shown). After assembly of the labels, the indexed strip is cut to form the labels, each label is magnetically tested and the functional labels are separated from their protective film to be placed on a packaging strip.

An alternative manufacturing method includes using rectangles of double faced adhesive 20 which are precut (separated from one another and comprising slot 21), for example, by the adhesive manufacturer. Double faced adhesive rectangles 20 are then delivered maintained together by a strip of protective film 24, and they are unglued one by one from the protective film, by a machine or by an operator, to be glued to the bases. The labels can then be manufactured according to the embodiment of FIGS. 1 and 2. In this case, connections 18 and resin drop 19 of protection of the chip and connections will be formed before gluing the double faced adhesive on base 14. The electromagnetic testing of each connected chip 12 may also be performed before gluing the double faced adhesive, which implies that a rejected defective component represents a smaller loss. The labels of FIGS. 3 to 9 may also be formed according to this alternative.

Figure 11:
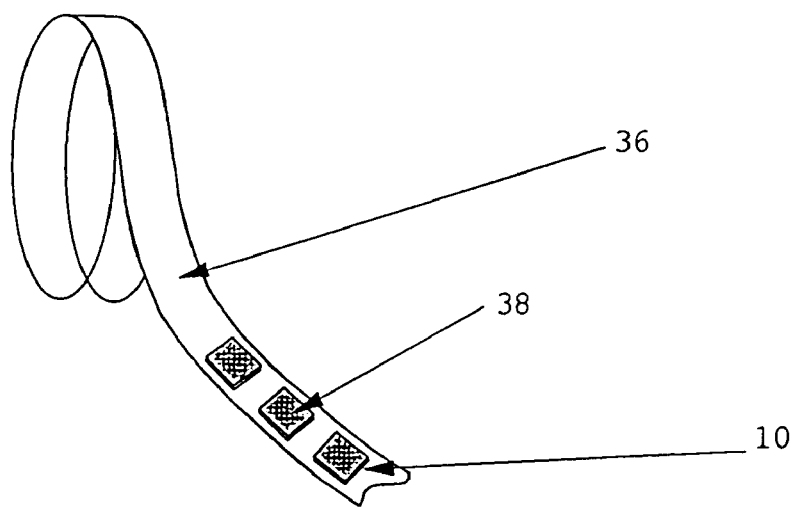
FIG. 11 schematically shows a final packaging of labels according to the present invention.

FIG. 11 shows a packaging strip 36 comprising labels 10, the second surface of which has been covered with a logo or a code 38, ready to be sold.

Of course, the present invention is likely to have various alterations, modifications, and improvements which will readily occur to those skilled in the art. In the embodiment of FIGS. 1 and 2, a cavity may for example be formed in the upper half of the thickness of base 14 to receive chip 12, and thus decrease the label thickness and facilitate the forming of drop 19. Further, the surface of the base which is not glued to the double-faced adhesive may be painted or printed or covered with an easily paintable or printable material. Moreover, the preceding descriptions relate to self-adhesive labels, but the present invention may also apply to any self-adhesive electronic circuit, for example, a sensor. In this regard, protection resin 22, which is conventionally opaque, may be replaced in the embodiment of FIGS. 7 and 8 with a transparent protection resin if the chip includes light-sensitive circuits such as photo-voltaic or charge coupling circuits. Resin drop 22 may then be lens-shaped for a better reception of the light by the chip.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A self-adhesive electronic circuit including a planar base having first and second base surfaces, an antenna attached on the first surface of the base, a chip connected to the antenna, and a double faced adhesive glued on one of the base surfaces, the double faced adhesive having an opening and the chip being arranged at least partially in the opening, wherein the double faced adhesive has first and second adhesive surfaces, wherein the first adhesive surface is glued on one of the base surfaces, and wherein the second adhesive surface is covered by a protective cover which is removable to expose the second adhesive surface as an outward adhesive surface of the self-adhesive electronic circuit.

2. The self-adhesive electronic circuit of claim 1, wherein the chip is glued on the first surface of the base and is connected to the antenna by connection wires, the wires and the chip being covered with a drop of resin.

3. The self-adhesive electronic circuit of claim 1, wherein an etched surface of the chip faces the first surface of the base, and the chip is connected to the antenna by welding beads.

4. The self-adhesive electronic circuit of claim 1, wherein an etched surface of the chip faces the back of the first surface of the base, the chip is placed in a slot made through the base, and the chip is connected to the antenna by welding beads, the chip being attached to the base by a drop of resin.

5. The self-adhesive electronic circuit of claim 1, wherein an etched surface of the chip faces the back of the first surface of the base and the chip is connected to the antenna by welding beads located in connection slots going through the base, the chip being attached to the base by a drop of resin.

6. The self-adhesive electronic circuit of claim 1, wherein the base is made of a flexible sheet.

7. The self-adhesive electronic circuit of claim 1, wherein the surface of the base which does not receive the double faced adhesive is provided to receive printing of a pattern, of a text or of a code.

8. A method of manufacturing the self-adhesive electronic circuit of claim 1, wherein the attachment of the double faced adhesive on the base includes the steps of:
    forming a rectangle of double faced adhesive including an opening,
    gluing the adhesive rectangle on a packaging protective film,
    ungluing the adhesive rectangle from the packaging protective film, and assembling the adhesive rectangle on the base.

9. The electronic circuit of claim 1, wherein the double faced adhesive comprises a double faced adhesive tape.

10. A method of using the self-adhesive electronic circuit of claim 1, the method comprising acts of:
    (A) removing the protective cover covering the second adhesive surface of the double faced adhesive to expose the second adhesive surface as the outward adhesive surface of the self-adhesive electronic circuit; and
    (B) adhering the outward adhesive surface of the self-adhesive electronic circuit to a non-planar surface.

11. The self-adhesive electronic circuit of claim 1, wherein the protective cover comprises a film.

12. The self-adhesive electronic circuit of claim 1, wherein the chip does not protrude past the second adhesive surface of the double faced adhesive.

13. An electronic circuit, comprising:
    a base having first and second surfaces;
    an antenna supported by the first surface of the base;
    a double faced adhesive having first and second surfaces, the first surface of the double faced adhesive being adhered to the first surface of the base, the second surface of the double faced adhesive being covered with a protective cover, the double faced adhesive having a thickness in a direction extending away from the first surface, the double faced adhesive having an opening, wherein at least a portion of the antenna is disposed in the opening; and
    an electronic chip disposed at least partially in the opening and electrically coupled to the antenna, the electronic chip having a height in a direction extending away from the first surface;
    wherein the thickness of the double faced adhesive is greater than or equal to the height of the electronic chip, and wherein the protective cover covering the second surface of the double faced adhesive is removable to expose the second surface of the double faced adhesive as an outward adhesive surface of the electronic circuit that enables the electronic circuit to be adhered to a non-planar surface.

14. The electronic circuit of claim 13, further comprising connection wires which electrically couple the electronic chip to the antenna and a resin which covers the connection wires and the electronic chip, the resin having a height in a direction extending away from the first surface, wherein the thickness of the double faced adhesive is greater than or equal to the height of the resin.

15. The electronic circuit of claim 13, further comprising welding beads which electrically couple the electronic chip to the antenna, wherein the chip has an etched surface which faces the first surface of the base.

16. The electronic circuit of claim 13, further comprising welding beads which electrically couple the electronic chip to the antenna and a resin which attaches the electronic chip to the base, the base having a slot in which the electronic chip is arranged, the electronic chip having an etched surface which faces the base, the resin having a height in a direction extending away from the first surface, wherein the thickness of the double faced adhesive is greater than or equal to the height of the resin.

17. The electronic circuit of claim 13, further comprising welding beads which electrically couple the electronic chip to the antenna and a resin which attaches the electronic chip to the base, the base having connection slots through which the welding beads reach the antenna, the electronic chip having an etched surface which faces the base, the resin having a height in a direction extending away from the first surface, wherein the thickness of the double faced adhesive is greater than or equal to the height of the resin.

18. The electronic circuit of claim 13, wherein the base is composed of a flexible sheet.

19. The electronic circuit of claim 13, wherein the surface of the base which does not receive the double faced adhesive is provided to receive printing of a pattern, text or code.

20. The electronic circuit of claim 13, wherein the protective cover comprises a film.

21. An electronic circuit, comprising:
    a base having first and second surfaces;
    an antenna supported by the first surface of the base;

a double faced adhesive having first and second surfaces, the first surface of the double faced adhesive being adhered to the first surface of the base, the second surface of the double faced adhesive being covered with a protective cover, the double faced adhesive having an opening, wherein at least a portion of the antenna is disposed in the opening; and an electronic chip disposed at least partially in the opening and electrically coupled to the antenna;

wherein the electronic chip is spaced from and does not contact the double faced adhesive, and wherein the protective cover covering the second surface of the double faced adhesive is removable to expose the second surface of the double faced adhesive as an outward adhesive surface of the electronic circuit that enables the electronic circuit to be adhered to a non-planar surface.

22. The electronic circuit of claim 21, further comprising connection wires which electrically couple the electronic chip to the antenna and a resin which covers the connection wires and the electronic chip.

23. The electronic circuit of claim 21, further comprising welding beads which electrically couple the electronic chip to the antenna, wherein the electronic chip has an etched surface which faces the first surface of the base.

24. The electronic circuit of claim 21, further comprising welding beads which electrically couple the electronic chip to the antenna and a resin which attaches the electronic chip to the base, the base having a slot in which the electronic chip is arranged, the electronic chip having an etched surface which faces the base.

25. The electronic circuit of claim 21, further comprising welding beads which electrically couple the electronic chip to the antenna and a resin which attaches the electronic chip to the base, the base having connection slots through which the welding beads reach the antenna, the electronic chip having an etched surface which faces the base.

26. The electronic circuit of claim 21, wherein the base is composed of a flexible sheet.

27. The electronic circuit of claim 21, wherein the surface of the base which does not receive the double faced adhesive is provided to receive printing of a pattern, text or code.

28. The electronic circuit of claim 21, wherein the protective cover comprises a film.

29. The self-adhesive electronic circuit of claim 21, wherein the chip does not protrude past the second adhesive surface of the double faced adhesive.

* * * * *